United States Patent
Renz et al.

(10) Patent No.: US 8,436,615 B2
(45) Date of Patent: May 7, 2013

(54) DETUNABLE WAVEGUIDE ANTENNA ASSEMBLY

(75) Inventors: Wolfgang Renz, Erlangen (DE); Karsten Wicklow, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 378 days.

(21) Appl. No.: 12/832,267

(22) Filed: Jul. 8, 2010

(65) Prior Publication Data

US 2011/0012810 A1 Jan. 20, 2011

(30) Foreign Application Priority Data

Jul. 14, 2009 (DE) .......................... 10 2009 033 084

(51) Int. Cl.
*G01R 33/00* (2006.01)
*A61B 5/055* (2006.01)

(52) U.S. Cl.
USPC ........... 324/318; 324/322; 324/309; 600/423; 600/433; 600/410; 343/913

(58) Field of Classification Search .................. 324/318, 324/322, 300, 307, 309–314, 222; 343/913, 343/743, 770, 776, 785; 600/410, 423
See application file for complete search history.

(56) References Cited

U.S. PATENT DOCUMENTS

| 4,667,160 A | 5/1987 | Krause |
| 4,680,550 A | 7/1987 | Krause |
| 5,170,140 A * | 12/1992 | Lowe et al. .................. 333/157 |
| 5,294,886 A * | 3/1994 | Duerr ............................ 324/318 |

* cited by examiner

*Primary Examiner* — Vibol Tan
(74) *Attorney, Agent, or Firm* — Schiff Hardin LLP

(57) ABSTRACT

A waveguide antenna assembly for a magnetic resonance tomography apparatus, particularly a waveguide antenna assembly that can be detuned for an operation with local coils, is composed of multiple metal surfaces connected by diodes respectively located between the metal surfaces. Only when the diodes are through-connected between these metal surfaces are the surfaces connected with one another in terms of RF signals via these diodes, so the assembly operates as a waveguide antenna. When the diodes are disabled between these metal surfaces, the surfaces are unconnected with one another for RF signals.

19 Claims, 2 Drawing Sheets

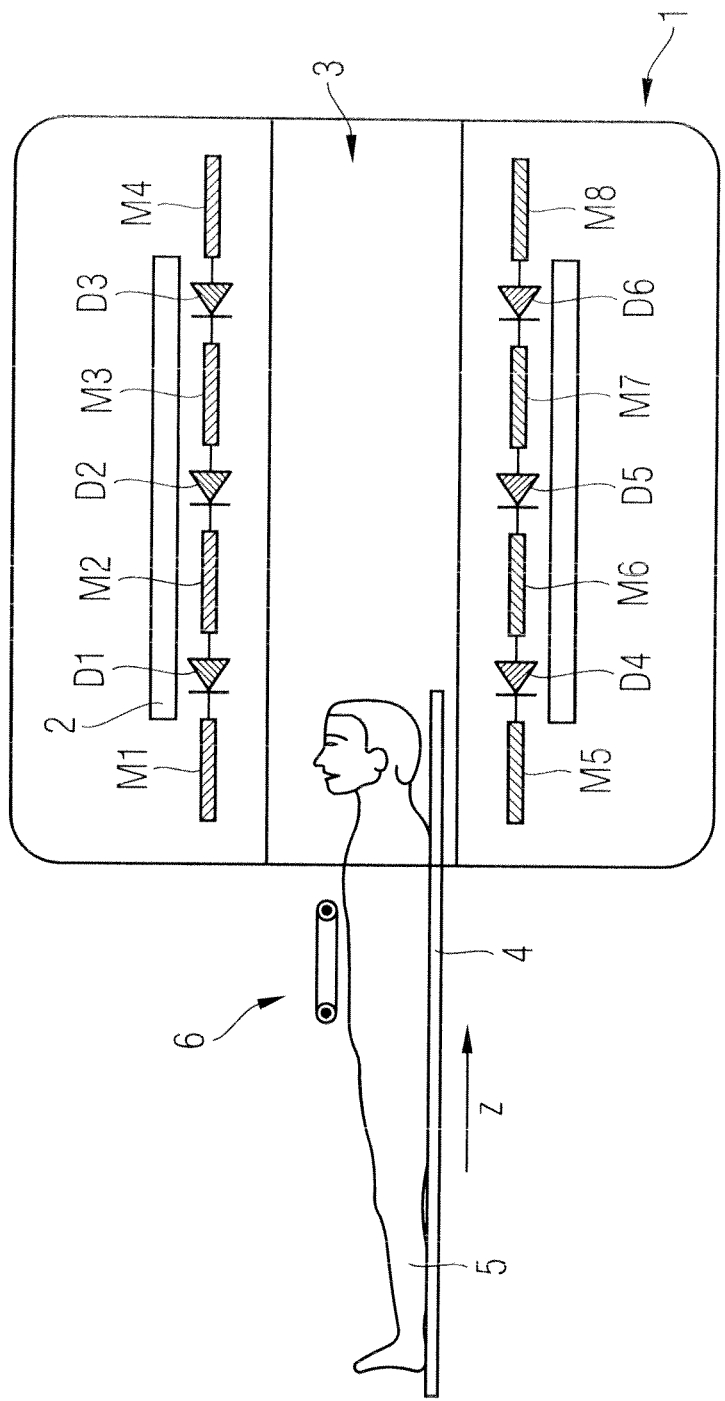

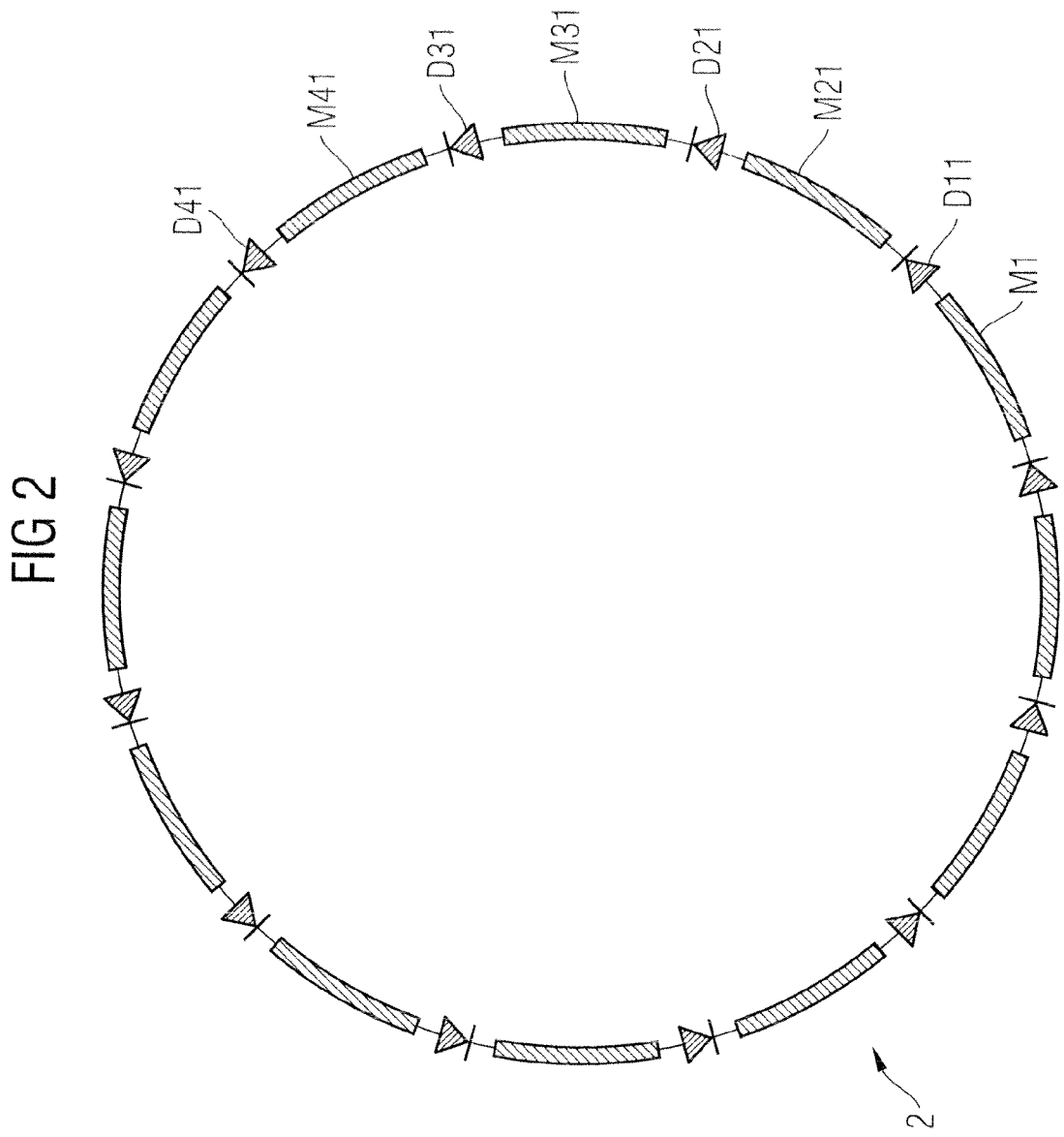

DETUNABLE WAVEGUIDE ANTENNA ASSEMBLY

BACKGROUND OF THE INVENTION

1. Field of the Invention

The present invention concerns a waveguide antenna assembly for a magnetic resonance tomography apparatus.

2. Description of the Prior Art

Magnetic resonance apparatuses, in particular for the examination of patients via magnetic resonance tomography, are generally known (for example from DE10314215B4)

Modern magnetic resonance systems (also called MRI or MRT) normally operate with multiple different antennas to emit radio-frequency pulses for nuclear magnetic resonance excitation and/or to receive induced magnetic resonance signals. A magnetic resonance system frequently has a larger coil (known as a whole-body coil, also called a body coil) that is normally permanently installed in the apparatus, as well as multiple small surface coils (also called local coils). In contrast to a whole-body coil, surface coils serve to acquire detailed images of body parts or organs of a patient that are located relatively close to the surface of the body.

It is known from Pruessmann et al that an antenna for UHF-MRI is based on the principle of wave propagation in waveguides. Use is made of the fact that a metal tube as already present is in an MR system (for example as a standard provided RF shield or an inner metal wall of the magnet) can function as a waveguide up to a specific limit frequency. This limit frequency can be exceeded in MRT systems.

SUMMARY OF THE INVENTION

An object of the present invention is to optimize use of such a waveguide.

According to the invention, a waveguide antenna assembly for a magnetic resonance tomography apparatus, is composed of multiple metal surfaces that are unconnected with one another in terms of RF signals but are configured to form a waveguide antenna, when connected for RF signals. Diodes are located between the metal surfaces. Metal surfaces in a state in which diodes are (conductively) through-connected between these metal surfaces are conductively connected with one another via these diodes for RF signals. Metal surfaces in a state in which diodes are blocking (are not through-connected) between these metal surfaces are unconnected with one another (separated from one another) in terms of RF signals.

A solution is described in which, instead of continuous waveguides for RF, a waveguide antenna is subdivided into (relatively small) metal surfaces.

The metal surfaces are advantageously connected with PIN diodes.

When these PIN diodes are fed with current (thus a current flows through them in the conducting direction), they represent a low-resistance (low-ohm) connection; the waveguide antenna thus functions "normally" and passes RF signals. If the diodes are charged with a cutoff voltage (blocking voltage; reverse bias; reverse voltage) they represent an open switch.

The subdivision of the waveguide antenna into flat pieces is advantageously selected so that, given a deactivation of diodes, the currents that are required for the wave propagation in the waveguide wall are disrupted as much as possible in the spatial surroundings of said diodes (the metal plates adjacent to them).

In the event that an RF shield present between the gradient coil and the RF coils in an MR system is used as a waveguide antenna, it can advantageously be taken into account that this RF shield is already structured in segments in order to suppress gradient eddy currents. To improve the RF properties of this shield, the interruptions of this shield are frequently RE-shorted with capacitors. These capacitors are advantageously replaced with PIN diodes, and thus the RF properties of the shield are specifically made to be manipulable with regard to the goal of deactivating the waveguide antenna.

The goal of a targeted local or complete degradation of the waveguide properties of a waveguide antenna can be supported in that RF-damping material is arranged outside of the waveguide antenna.

In the case of a waveguide antenna in the form of an RF shield within a gradient coil, the materials typically used in gradient coils can represent a good RF damping.

In the case of a separate waveguide antenna—for example to extend the waveguide antenna beyond a gradient coil in the z-direction—it is advantageous to fill up the area outside the waveguide antenna, for example with foamed carbon.

BRIEF DESCRIPTION OF THE DRAWINGS

FIG. 1 schematically illustrates a whole-body magnetic resonance tomography apparatus.

FIG. 2 shows a waveguide antenna composed of multiple metal surfaces that can be connected with their adjacent metal surfaces via diodes.

DESCRIPTION OF THE PREFERRED EMBODIMENTS

FIG. 1 shows a magnetic resonance apparatus 1 with a whole-body gradient coil 2 (whose inner wall can, for example, be a waveguide antenna described in the following) with a tube-shaped space 3 into which a patient bed 4 (for example with an examination subject or patient 5 and local coil arrangement 6) can be driven in the direction of the arrow z in order to generate exposures of the patient 5. Here a local coil array 6 (with multiple local coils and channels for signals from the local coils) with which good exposures are enabled in a local region is placed on the patient, the signals of which local coil array can be evaluated (converted into images etc.) by a known evaluation device that can be connected via coaxial cables etc.

FIG. 2 shows a waveguide antenna 2 made up of multiple metal surfaces M1, M2, M3, M4, M5, M6, M7, M8, M21, M31, M41 etc. that are themselves not connected with one another for RF signals. The metal surfaces M1, M2, M3, M4, M5, M6, M7, M8, M21, M31, M41 etc. are connected via diodes D1, D2, D3, D4, D5, D6, D21, D31, D41 with respective ones of the metal surfaces M1, M2, M3, M4, M5, M6, M7, M8, M21, M31, M41 that are adjacent in the circumferential direction and/or in the axial longitudinal direction of the waveguide antenna 2, wherein the diodes can be switched in one or advantageously two directions to be conductive or non-conductive.

For example, if the metal surface M2 in FIG. 1 is connected via the diode D1 with the metal surface M1 and via the diode D2 with the metal surface M3, and as FIG. 2 shows, the metal surface M1 is also connected via the diode D11 with the metal surface M21.

The diodes can respectively be switched to be either conductive or non-conductive (deactivated) for RF signals in order to thus optimally detune the waveguide antenna 2 per segment, in particular if one or more local coils are (also) used that should interfere less.

In a state in which diodes are connected through, the metal surfaces connected with them are connected with one another for RF signals via said diodes, while in a state in which diodes are not connected through (but rather are switched so that they are blocking), the metal surfaces connected with these diodes are not connected with one another for RF signals via said diodes.

A waveguide antenna according to the invention can be a metal tube made up of segments shaped like sections of a cylindrical shell, in the form of metal surfaces.

A waveguide antenna according to the invention can be an RF shield of a magnetic resonance tomography apparatus, in particular an RF shield of a whole-body gradient coil of a magnetic resonance tomography apparatus.

A waveguide antenna according to the invention can be an inner metal wall of a body coil magnet of a magnetic resonance tomography apparatus.

A waveguide antenna according to the invention can be an antenna for a UHF magnetic resonance tomography apparatus.

Although modifications and changes may be suggested by those skilled in the art, it is the intention of the inventors to embody within the patent warranted hereon all changes and modifications as reasonably and properly come within the scope of their contribution to the art.

We claim as our invention:

1. A waveguide antenna assembly for a magnetic resonance tomography apparatus, comprising:
   a plurality of individual metal surfaces unconnected with each other in terms of RF signals but configured to form a waveguide antenna when connected in terms of RF signals;
   a plurality of diodes respectively connected between said plurality of metal surfaces;
   said diodes being collectively activatable to produce respective through-connections among said plurality of metal surfaces to make said metal plates operate as a waveguide antenna conductive for RF signals, and said diodes being collectively deactivatable into a blocking state that makes said metal plates non-conductive for RF signals; and
   said diodes being configured for collective operation with a magnetic resonance local coil to simultaneously activate said local coil when said diodes are collectively activated and to detune said local coil when said diodes are deactivated.

2. A waveguide antenna assembly for a magnetic resonance tomography apparatus, comprising:
   a plurality of individual metal surfaces unconnected with each other in terms of RF signals but configured to form a waveguide antenna when connected in terms of RF signals;
   a plurality of diodes respectively connected between said plurality of metal surfaces; and
   said diodes being collectively activatable to produce respective through-connections among said plurality of metal surfaces to make said metal plates operate as a waveguide antenna conductive for RF signals, and said diodes being collectively deactivatable into a blocking state that makes said metal plates non-conductive for RF signals, said plurality of metal surfaces forming a tube composed of segments formed by said metal surfaces.

3. A waveguide antenna assembly for a magnetic resonance tomography apparatus, comprising:
   a plurality of individual metal surfaces unconnected with each other in terms of RF signals but configured to form a waveguide antenna when connected in terms of RF signals;
   a plurality of diodes respectively connected between said plurality of metal surfaces; and
   said diodes being collectively activatable to produce respective through-connections among said plurality of metal surfaces to make said metal plates operate as a waveguide antenna conductive for RF signals, and said diodes being collectively deactivatable into a blocking state that makes said metal plates non-conductive for RF signals, and wherein said diodes are operable to detune at least some of said plurality of metal surfaces during operation of a magnetic resonance local coil, to avoid interaction between said magnetic resonance local coil and said waveguide antenna.

4. A waveguide antenna assembly for a magnetic resonance tomography apparatus, comprising:
   a plurality of individual metal surfaces unconnected with each other in terms of RF signals but configured to form a waveguide antenna when connected in terms of RF signals;
   a plurality of diodes respectively connected between said plurality of metal surfaces;
   said diodes being collectively activatable to produce respective through-connections among said plurality of metal surfaces to make said metal plates operate as a waveguide antenna conductive for RF signals, and said diodes being collectively deactivatable into a blocking state that makes said metal plates non-conductive for RF signals; and
   said diodes being activated, when charged with a cutoff voltage, to make said waveguide antenna non-conducting for said RF signals, and said plurality of metal surfaces being subdivided relative to each other to produce a maximum disruption of said RF signals when said diodes are charged with said cutoff voltage.

5. A waveguide antenna assembly for a magnetic resonance tomography apparatus, comprising:
   a plurality of individual metal surfaces unconnected with each other in terms of RF signals but configured to form a waveguide antenna when connected in terms of RF signals;
   a plurality of diodes respectively connected between said plurality of metal surfaces;
   said diodes being collectively activatable to produce respective through-connections among said plurality of metal surfaces to make said metal plates operate as a waveguide antenna conductive for RF signals, and said diodes being collectively deactivatable into a blocking state that makes said metal plates non-conductive for RF signals; and
   RF damping material located at an exterior of said waveguide antenna.

6. A waveguide antenna assembly for a magnetic resonance tomography apparatus, comprising:
   a plurality of individual metal surfaces unconnected with each other in terms of RF signals but configured to form a waveguide antenna when connected in terms of RF signals;
   a plurality of diodes respectively connected between said plurality of metal surfaces;
   said diodes being collectively activatable to produce respective through-connections among said plurality of metal surfaces to make said metal plates operate as a waveguide antenna conductive for RF signals, and said diodes being collectively deactivatable into a blocking state that makes said metal plates non-conductive for RF signals; and filler material that fills an interior of said waveguide antenna.

7. A waveguide antenna assembly as claimed in claim 6 wherein said filler material is foamed carbon.

8. A waveguide antenna assembly for a magnetic resonance tomography apparatus, comprising:

a plurality of individual metal surfaces unconnected with each other in terms of RF signals but configured to form a waveguide antenna when connected in terms of RF signals, said waveguide antenna having a circumference, and comprising at least six of said plurality of metal surfaces distributed around said circumference;

a plurality of diodes respectively connected between said plurality of metal surfaces; and said diodes being collectively activatable to produce respective through-connections among said plurality of metal surfaces to make said metal plates operate as a waveguide antenna conductive for RF signals, and said diodes being collectively deactivatable into a blocking state that makes said metal plates non-conductive for RF signals.

9. A waveguide antenna assembly as claimed in claim 8 wherein said waveguide antenna comprises at least eight of said plurality of metal surfaces distributed around said circumference.

10. A waveguide antenna assembly as claimed in claim 8 wherein said waveguide antenna comprises at least sixteen of said plurality of metal surfaces distributed around said circumference.

11. A waveguide antenna assembly for a magnetic resonance tomography apparatus, comprising:

a plurality of individual metal surfaces unconnected with each other in terms of RF signals but configured to form a waveguide antenna when connected in terms of RF signals, said waveguide antenna having a length, and comprising at least two of said plurality of metal surfaces along said length;

a plurality of diodes respectively connected between said plurality of metal surfaces; and said diodes being collectively activatable to produce respective through-connections among said plurality of metal surfaces to make said metal plates operate as a waveguide antenna conductive for RF signals, and said diodes being collectively deactivatable into a blocking state that makes said metal plates non-conductive for RF signals.

12. A waveguide antenna assembly as claimed in claim 11 wherein said waveguide antenna comprises at least four of said plurality of metal surfaces along said length.

13. A waveguide antenna assembly as claimed in claim 11 wherein said waveguide antenna comprises at least eight of said plurality of metal surfaces along said length.

14. A magnetic resonance tomography apparatus, comprising:

a magnetic resonance data acquisition unit configured to execute magnetic resonance imaging protocols to generate magnetic resonance exposures of a patient, said magnetic resonance imaging protocols requiring generation of RF signals and said magnetic resonance data acquisition unit comprising a waveguide antenna that generates said RF signals in said magnetic resonance imaging protocols, said magnetic resonance data acquisition unit having a receptacle therein configured to receive a patient to expose the patient to said RF signals; and said waveguide antenna comprising a plurality of individual metal surfaces unconnected with each other in terms of RF signals but configured to form said waveguide antenna when connected in terms of RF signals, a plurality of diodes respectively connected between said plurality of metal surfaces, and said diodes being collectively activatable to produce respective through-connections among said plurality of metal surfaces to make said metal plates operate as a waveguide antenna conductive for RF signals, and said diodes being collectively deactivatable into a blocking state that makes said metal plates non-conductive for RF signals.

15. A magnetic resonance apparatus as claimed in claim 14 wherein said diodes are PIN diodes.

16. A magnetic resonance apparatus as claimed in claim 14 wherein said waveguide antenna is configured as an RF shield.

17. A magnetic resonance apparatus as claimed in claim 14 wherein said plurality of metal plates are configured to produce continuous capacitive coupling for said RF signals only when said diodes are activated.

18. A magnetic resonance apparatus as claimed in claim 14 wherein said plurality of metal surfaces are comprised of material to transmit said RF signals with low resistance in a transmission direction when said diodes are fed with current in the transmission direction.

19. A magnetic resonance apparatus as claimed in claim 14 wherein said receptacle of said magnetic resonance data acquisition unit is a hollow cylinder.

* * * * *